(12) United States Patent
Mann et al.

(10) Patent No.: US 7,507,340 B2
(45) Date of Patent: Mar. 24, 2009

(54) ION PROCESSING ELEMENT WITH COMPOSITE MEDIA

(75) Inventors: Nick R. Mann, Blackfoot, ID (US);
Troy J. Tranter, Idaho Falls, ID (US);
Terry A. Todd, Aberdeen, ID (US);
Ferdinand Sebesta, Prague (CZ)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 191 days.

(21) Appl. No.: 10/302,471

(22) Filed: Nov. 21, 2002

(65) Prior Publication Data

US 2003/0138563 A1    Jul. 24, 2003

Related U.S. Application Data

(62) Division of application No. 10/039,320, filed on Oct. 19, 2001, now Pat. No. 6,514,566.

(60) Provisional application No. 60/241,736, filed on Oct. 19, 2000.

(51) Int. Cl.
*B01D 39/20* (2006.01)

(52) U.S. Cl. .................. 210/502.1; 210/505; 210/508; 210/509

(58) Field of Classification Search ............. 210/502.1, 210/503, 504, 505, 506, 508, 509, 510.1, 210/679
See application file for complete search history.

(56) References Cited

U.S. PATENT DOCUMENTS

| 3,019,127 | A | * | 1/1962 | Czerwonka et al. | ......... 428/338 |
| 3,622,268 | A | | 11/1971 | Wade et al. | ........ 23/22 |
| 3,644,251 | A | * | 2/1972 | Wilhelmi | ............ 442/330 |
| 3,960,762 | A | | 6/1976 | Kroebel et al. | |
| 4,239,516 | A | * | 12/1980 | Klein | ............ 502/62 |
| 4,443,339 | A | * | 4/1984 | Rosevear | ............ 210/635 |

(Continued)

FOREIGN PATENT DOCUMENTS

CS      273369         7/2006

(Continued)

OTHER PUBLICATIONS

Brewer. K.N. et al., "AMP-PAN Column Tests for the Removal of 137Cs From Actual and Simulated INEEL High-Activity Wastes," Czech. J. Phys., 49, pp. 959-964. 1999.*

(Continued)

*Primary Examiner*—Matthew O Savage
(74) *Attorney, Agent, or Firm*—Trask Britt

(57) ABSTRACT

An ion processing element employing composite media disposed in a porous substrate, for facilitating removal of selected chemical species from a fluid stream. The ion processing element includes a porous fibrous glass substrate impregnated by composite media having one or more active components supported by a matrix material of polyacrylonitrile. The active components are effective in removing, by various mechanisms, one or more constituents from a fluid stream passing through the ion processing element. Due to the porosity and large surface area of both the composite medium and the substrate in which it is disposed, a high degree of contact is achieved between the active component and the fluid stream being processed. Further, the porosity of the matrix material and the substrate facilitates use of the ion processing element in high volume applications where it is desired to effectively process a high volume flows.

8 Claims, 4 Drawing Sheets

U.S. PATENT DOCUMENTS

| | | | |
|---|---|---|---|
| 4,548,790 A | 10/1985 | Horwitz et al. | 423/9 |
| 4,683,124 A | 7/1987 | Muscatello et al. | 423/6 |
| 4,826,604 A | 5/1989 | Faubel et al. | 210/661 |
| 4,835,107 A | 5/1989 | Horwitz et al. | 426/82 |
| 5,169,609 A | 12/1992 | Horwitz et al. | 423/10 |
| 5,268,097 A | 12/1993 | Girot et al. | 210/198.2 |
| 5,445,732 A | 8/1995 | Girot et al. | 210/198.2 |
| 5,454,946 A * | 10/1995 | Heagle et al. | 210/503 |
| 5,486,292 A * | 1/1996 | Bair et al. | 210/616 |
| 5,518,707 A | 5/1996 | Bedard et al. | 423/700 |
| 5,637,506 A | 6/1997 | Goken et al. | 436/57 |
| 5,667,695 A | 9/1997 | Bedard et al. | 210/681 |
| 5,788,826 A | 8/1998 | Nyberg | |
| 5,891,559 A | 4/1999 | Goken et al. | 428/220 |
| 5,906,734 A | 5/1999 | Girot et al. | 210/198.2 |
| 5,989,434 A * | 11/1999 | Lundquist et al. | 210/679 |
| 6,034,149 A | 3/2000 | Bleys et al. | |
| 6,103,122 A * | 8/2000 | Hou et al. | 210/502.1 |
| 6,312,598 B1 * | 11/2001 | Munson et al. | 210/317 |
| 6,395,830 B1 | 5/2002 | Jonas et al. | |
| 6,436,294 B2 * | 8/2002 | Lundquist | 210/674 |
| 6,514,566 B2 | 2/2003 | Mann et al. | |
| 2002/0121470 A1 | 9/2002 | Mann et al. | 210/287 |

OTHER PUBLICATIONS

Miller et al, Sep. Sci. Technol., 32(1-4), pp. 37-50, 1997.
Sebesta et al, Acta Polytech., 38(3), pp. 119-120, 1998.
Brewer et al, Czech. J. Phus., 49, pp. 959-964, 1999.
John et al, NATO Sci. Ser., Ser. 2, 53, pp. 155-168, 1999.
PCT International Search Report, dated Apr. 19, 2002 for PCT/US01/50702.

* cited by examiner

ION PROCESSING ELEMENT WITH COMPOSITE MEDIA

RELATED APPLICATION

This application is a divisional of pending application Ser. No. 10/039,320 filed Oct. 19, 2001 now U.S. Pat. No. 6,514,566, pending which claims priority to U.S. patent application Ser. No. 60/241,736 filed Oct. 19, 2000 and is incorporated by reference.

CONTRACTUAL ORIGIN OF THE INVENTION

The United States Government has certain rights in this invention pursuant to Contract No. DE-AC07-99ID13727, and Contract No. DE-AC07-05ID14517 between the United States Department of Energy and Battelle Energy Alliance, LLC.

BACKGROUND OF THE INVENTION

1. Field of the Invention

The present invention relates generally to the preparation and use of composite media for use in ion processing. More particularly, embodiments of the present invention relate to the preparation and use of ion processing elements that include composite media dispersed in a porous substrate.

2. Related Technology

Effective and efficient ion processing is an important consideration in numerous chemical and industrial processes. In general, ion processing refers to those processes, and/or devices which implement such processes, that are used to facilitate neutralization, removal, concentration, or other processing, of one or more ions present in a fluid stream, examples of which include industrial waste and process streams. One example of such a process concerns the removal of materials such as cesium, strontium, and/or uranium from an industrial waste stream prior to the discharge of the fluid stream into the environment.

While ion processing components and processes are often employed to remove undesirable constituents of a fluid volume or stream, such components and processes may also be used to collect and concentrate one or more desirable constituents of a fluid volume or stream so that those constituents can then be reserved for future use.

One area where ion processing techniques, materials, and devices are particularly useful is in the industrial environment. Typical industrial waste and process streams present at least two significant challenges to ion processing efforts. The first challenge relates to the flow rates of such industrial waste and process streams. Because industrial waste and process streams are often characterized by relatively high flow rates, the associated ion processing materials, systems, and components must be capable of admitting and processing the high flow rate waste and process streams without introducing an undue pressure drop or other resistance to flow that would tend to compromise the flow rate of those streams, and thereby slow down the overall rate at which ion processing occurs.

Another challenge that must be considered when implementing the treatment of industrial waste and process streams relates to the level of cleanliness that must be attained in the processed stream. In particular, the streams produced in industrial environments are often required to meet stringent standards with regard to the permissible concentration of various contaminants or other materials that are ultimately discharged into the environment. Thus, the treatment systems and devices must not only be able to handle relatively high fluid flow rates, but they must do so at a high level of efficiency.

Generally, the effectiveness and efficiency of a particular ion processing material is at least partially a function of the total surface area of the active component that contacts the material or fluid to be processed. The surface area, in turn, is a function of the porosity, or pore volume, of the ion processing material, so that relatively more porous ion processing materials typically possess a relatively greater surface area than relatively less porous ion processing materials. Thus, when considering two ion processing materials equivalent in all other regards, an ion processing material with a relatively larger surface area is capable of removing a relatively greater amount of contaminants or impurities from a fluid stream than an ion processing material with a relatively smaller surface area. In light of this relationship, a number of ion processing materials, systems, and devices have been devised with a view towards providing a relative increase in the surface area of the ion processing material so as to improve its effectiveness.

Various methods may be used to prepare ion processing materials so as to provide a relative increase in the surface area of the active component, of the ion processing material, that comes into contact with the fluid stream to be processed. In one case, the ion processing material takes the form of a composite medium that generally includes a supporting matrix and one or more active components dispersed within the matrix. Typically, the matrix comprises a plurality of small, slightly porous particles, sometimes referred to as beads. As suggested above, the overall surface area of the ion processing material that contacts the fluid stream simply comprises the sum of the surface areas of each of the individual beads which, in turn, is a function of pore volume.

In order to form the ion processing material, the matrix material is mixed with a particular active component selected for its ability to remove one or more pre-determined constituents from the fluid stream. The ion processing material thus produced is typically disposed in a column through which the fluid stream to be processed is passed. Because the beads of the matrix material often assume a somewhat spherical shape, a plurality of spaces are cooperatively defined by adjacent beads. Accordingly, the fluid stream is able to flow through the ion processing material by working its way through the spaces between the individual beads.

While the slight porosity of some beads allows for a relatively greater ion processing area than would be possible if the beads were simply solid, such matrix materials have, as a result of their relatively small pore volume, proven rather ineffective in providing the performance required for effective and efficient processing of high volume fluid streams. Of course, the surface area of such ion processing materials can be increased somewhat by increasing the number of beads present in a particular column. However, there are practical limits to the attainment of very small bead sizes. Furthermore, while an increase in the number of beads produces a desirable overall increase in pore volume, and thus ion processing area, the increase represents a tradeoff with respect to the flow rate that a particular ion processing material can effectively accommodate.

In particular, as bead size is reduced, the size of the air spaces between adjacent beads is correspondingly reduced. Reduction in the size of the air spaces has at least one unfavorable consequence with respect to the flow of the fluid stream. Specifically, assuming a constant flow velocity, the volume of fluid that can flow through an opening is primarily a function of the size or area of that opening. This idea is generally expressed in the relationship Q=Va, where "Q" is the volume of fluid flow per unit of time, "V" is the velocity of the fluid, and "a" is the area through which the fluid passes.

In general then, where two volumes of ion processing materials in the form of respective composite media, equal in all other respects, have different numbers of beads, the volume of the ion processing material with relatively more beads defines a relatively smaller space through which the process stream can flow. In view of the aforementioned flow relationship, this means that the volume of ion processing material with a relatively greater number of beads is relatively more resistant to the flow of the process stream. Accordingly, in the case of an ion processing material comprised of very small particles, a powdered ion processing material for example, the resistance of the ion processing material to fluid flow is significant.

Thus, in the case of ion processing materials comprised of a composite medium employing a bead type matrix, the surface area of the ion processing material can be readily increased by increasing the number of beads. However, due to the inverse relationship, discussed above, between the air volume defined by the ion processing material and the ability of a given volume of the ion processing material to pass a predetermined flow, there are practical limits to the extent to which the surface area may usefully be increased.

As suggested earlier, another common ion processing material configuration is designed along the same general principles as those ion processing materials formed as composite media, but takes on a somewhat different form. In this particular configuration, no matrix is employed. Rather, a finely granulated or powdered active component is simply compressed under high pressure to form an ion processing material comprising a plurality of granules, or pellets, which are then disposed in a column for processing of a fluid stream.

While ion processing materials using compressed active component configurations typically have relatively large surface areas, they suffer from a variety of significant shortcomings. First, because the active component is initially in a powdered form, the flow of the fluid through a bed of granules of the active component of the ion processing material tends to wash away some of the active component, thus reducing the effectiveness and efficiency of the ion processing material over time. Another problem is that granules or pellets of the compressed active component tend to be rather brittle and can be easily broken and thereby rendered ineffective. Further, ion processing materials formed in this manner tend to crumble and fall apart over a period of time. Such ion processing material configurations are not well suited to withstand the rough handling and other conditions that may occur in many industrial environments.

Yet another shortcoming of compressed active component ion processing materials concerns the compression process that is used to form the granules or pellets of the compressed active component. In particular, large compressive forces are typically employed in order to ensure that the active component granules assume and retain the desired shape and size. However, the forces used to form the active component granules compress the active component so tightly that it is often the case that the fluid flow being processed never penetrates to the active component at the inner portion of the granules. Thus, the ion processing capacity of the active component in these types of ion processing materials is not fully utilized and much of the active component is essentially wasted. Such waste unnecessarily increases the amount, and thus the cost, of the ion processing material.

While the aforementioned shortcomings are of some concern in low volume ion processing applications such as might be encountered in a laboratory, these characteristics of ion processing materials that comprise compressed active component granules render such ion processing materials particularly unsuited for high volume applications such as are typically encountered in industrial environments.

In environmental applications, for example, it is often the case that large volumes of fluid, in some cases as much as 100 to 400 gallons, must be sampled so that analyses of the sample will provide accurate and scientifically valid results. Types of fluids typically sampled include, but are not limited to, ocean water, groundwater, water from inland waterways such as lakes and rivers, landfill runoff, and the like.

Because of the inability of known ion processing media, devices, and systems to readily process large volumes of fluids, personnel sampling these fluids are often compelled to collect the sample required and transport the sample back to a processing facility for analysis. Transportation of such large samples can be problematic in many cases, especially where the sample is gathered in a location remote from the laboratory or facility where the sample is to be analyzed. In particular, transportation of large samples from remote locations is both time-consuming and expensive.

A related problem concerns processing of large samples once they finally reach the processing facility. Typically, such samples must be evaporated and/or otherwise treated by processes comprising numerous steps so that the constituents of those samples can be concentrated and analyzed. Such extensive processing is undesirable, at least because it is time-consuming, expensive, and often requires special equipment.

In view of the foregoing problems and shortcomings with existing ion processing materials and systems, it would be an advancement in the art to provide an ion processing element comprising a large surface area composite medium disposed in a porous substrate which offers relatively little resistance to fluid flow, wherein the composite medium comprises one or more active components uniformly dispersed in a matrix material having a relatively high surface area so as to facilitate relatively high rates of ion processing.

BRIEF SUMMARY OF THE INVENTION

The present invention has been developed in response to the current state of the art, and in particular, in response to these and other problems and needs that have not been fully or adequately addressed by currently available ion processing materials and elements.

Briefly summarized, embodiments of the invention are directed to an ion processing element comprising a composite medium dispersed in a highly porous substrate. The composite medium includes a large surface area matrix material within which one or more active components are disposed. Embodiments of the invention are particularly well suited for use in high volume applications requiring effective and efficient removal, or other processing, of actinides such as uranium (U), plutonium (Pu), and americium (Am), lanthanides such as europium (Eu) and cerium (Ce), alkali metals such as cesium (Cs), alkaline earth metals such as strontium (Sr), organic contaminants, and chlorine, such as from water that is to be used for human consumption. In general however, embodiments of the invention are effective in any application where efficient and effective ion processing of high volume flows is required.

Note that, as used herein, "actinides" include any and all elements of the Actinide Series as depicted by the periodic chart of the elements, as well as any and all compounds substantially comprising an element of the Actinide Series. Similarly, "lanthanides" refer to any and all elements of the Lanthanide Series as depicted by the periodic chart of the elements, as well as any and all compounds substantially comprising an element of the Lanthanide Series.

Embodiments of ion processing elements include a porous substrate, preferably comprising fibrous glass, impregnated with a composite medium. The composite medium, in turn, comprises an active component supported by a porous matrix material. The matrix material, in some embodiments, is substantially comprised of an organic polymer, such as polyacrylonitrile (PAN). One or more active components, such as crystalline silicotitanate (CST), carbon, or octyl (phenyl) N,N-diisobutylcarbamoylmethylphosphine oxide (CMPO) for example, are dispersed throughout the matrix material.

In one embodiment of the invention, the composite medium is prepared by first dissolving a desired amount of PAN in a solvent, nitric acid ($HNO_3$) for example, so as to produce a matrix solution of a desired concentration. One or more active components are then mixed with the matrix solution to produce a composite medium solution (CMS), which may comprise a suspension, emulsion, solution, or other form. Preferably, both the dissolution of the PAN and the mixing of the active component(s) with the matrix solution are performed at room temperature and pressure.

A pressure differential is then established across the porous substrate, and the CMS is introduced on the high pressure side of the pressure differential. The pressure differential causes the CMS to flow into, and substantially impregnate, the porous substrate. The CMS impregnated substrate is then immersed in a water bath so as to facilitate substantial dilution of the nitric acid the CMS. Such dilution of the solvent desirably causes the composite medium to solidify in the substrate. After the solvent has been substantially diluted, or otherwise neutralized, the ion processing element is then dried and ready for use.

In operation, a fluid stream is passed through the ion processing element and the composite media disposed therein removes one or more constituents of the fluid stream. By virtue of their porosity, the substrate and the matrix material possess a large pore volume which, as previously discussed, translates to a large surface area for ion processing. Thus, the active component dispersed throughout the matrix possesses a high ion processing capacity with respect to the fluid stream in contact therewith.

Another desirable consequence of the porosity of the substrate is that the substrate offers relatively little resistance to flow through the ion processing element, and thus the kinetic properties of the ion processing element are favorable. That is, the porosity of the substrate in which the composite media are deposited facilitates accommodation of a high volume fluid stream without imposing a material drop in pressure of the fluid stream that would otherwise compromise processing rates. Further, the portability of the ion processing element makes it well-suited for use in off-site processing of fluids. Finally, because the matrix material is relatively durable, it is well suited to withstand the rough handling and environmental conditions typically encountered in industrial applications and other uses.

These and other features and advantages of the present invention will become more fully apparent from the following description and appended claims.

BRIEF DESCRIPTION OF THE DRAWINGS

In order to more fully understand the manner in which the above-recited and other advantages and features of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention and its presently understood best mode for making and using the same will be described and explained with additional specificity and detail through the use of the accompanying drawings in which.

DETAILED DESCRIPTION OF EMBODIMENTS OF THE INVENTION

Reference will now be made to figures wherein like structures will be provided with like reference designations. It is to be understood that the drawings are diagrammatic and schematic representations of exemplary embodiments of the invention, and are not to be construed as limiting the scope of the invention in any way.

In general, the present invention relates to an ion processing element, employing composite media disposed in a porous substrate, for use in removing various constituents of a fluid stream. FIGS. 1 through 4 indicate various exemplary embodiments of an ion processing element and related materials, processes, and systems.

Figure 1:
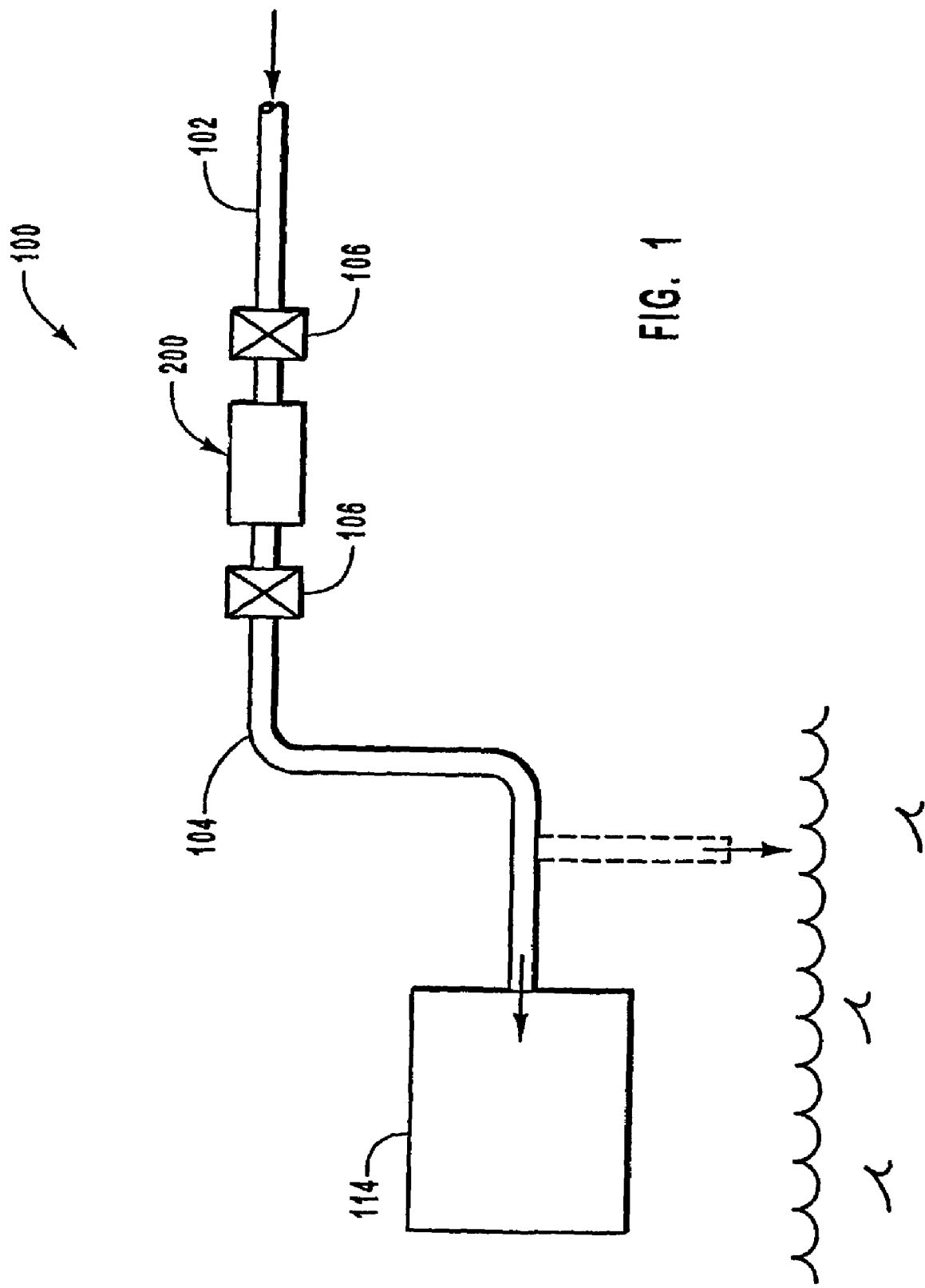
FIG. 1 illustrates various features of an embodiment of an ion processing system.

Reference is first made to FIG. 1, wherein an ion processing system is indicated generally at 100, and the direction of the flow of fluid through ion processing system 100 is indicated by arrows. In general, ion processing system 100 includes column assembly 200, column inlet piping 102 and column outlet piping 104. Disposed upstream and downstream of column assembly 200 are isolation valves 106. Ion processing system 100 also includes a reservoir 114 in fluid communication with column outlet piping 104. Additionally, ion processing system 100 may include a variety of other components as well, wherein such components may include, but are not limited to, prime movers such as pumps.

Various types of diagnostic and/or monitoring instrumentation may also be provided in ion processing system 100, including, but not limited to, devices for measuring temperatures, flowrates, and ion concentration, at one or more points throughout ion processing system 100.

In one embodiment, ion processing system 100 is used in conjunction with the processing of a fluid stream containing one or more actinides such as uranium (U), plutonium (Pu), and/or americium (Am), or their compounds, lanthanides such as europium (Eu) and cerium (Ce), and/or with fluid streams containing alkali metals such as cesium (Cs), or alkaline earth metals such as strontium (Sr), or their compounds. Other embodiments of ion processing system 100 are well suited to effectuate the removal of organic contaminants, and chlorine (Cl) from fluid streams. Yet other exemplary applications include industrial water treatment, drinking water treatment, alkaline waste treatment, radioactive waste treatment, and treatment of various types of waste produced, for example, as a result of industrial operations and processes. Of course, the use of ion processing system 100 is not limited to these exemplary applications. For example, ion processing system 100 is equally well suited for use in conjunction with relatively small scale systems and operations such as are typically employed in laboratories and similar facilities. Note that, as contemplated herein, "fluid stream" includes streams having both gaseous and liquid components, as well as streams which are in substantially liquid form, and streams which substantially comprise one or more gaseous components.

In operation, the fluid stream to be processed is directed into ion processing assembly inlet piping 102 and passes through ion processing assembly 200, where one or more constituents are substantially removed, and is then directed to reservoir 114 by way of ion processing assembly outlet piping 104, preparatory to further processing, or disposal. Depending upon such variables as the content(s), temperature, and volume of the fluid stream, the fluid stream may alternatively be directed to a waterway or other portion of the environment after processing, as suggested by the phantom lines in FIG. 1. When it is desired to remove ion processing assembly 200, isolation valves 106 can be shut so as to prevent flow through ion processing assembly inlet piping 102 and ion processing assembly outlet piping 104, and thereby facilitate the removal and/or replacement of ion processing assembly 200.

Figure 2:
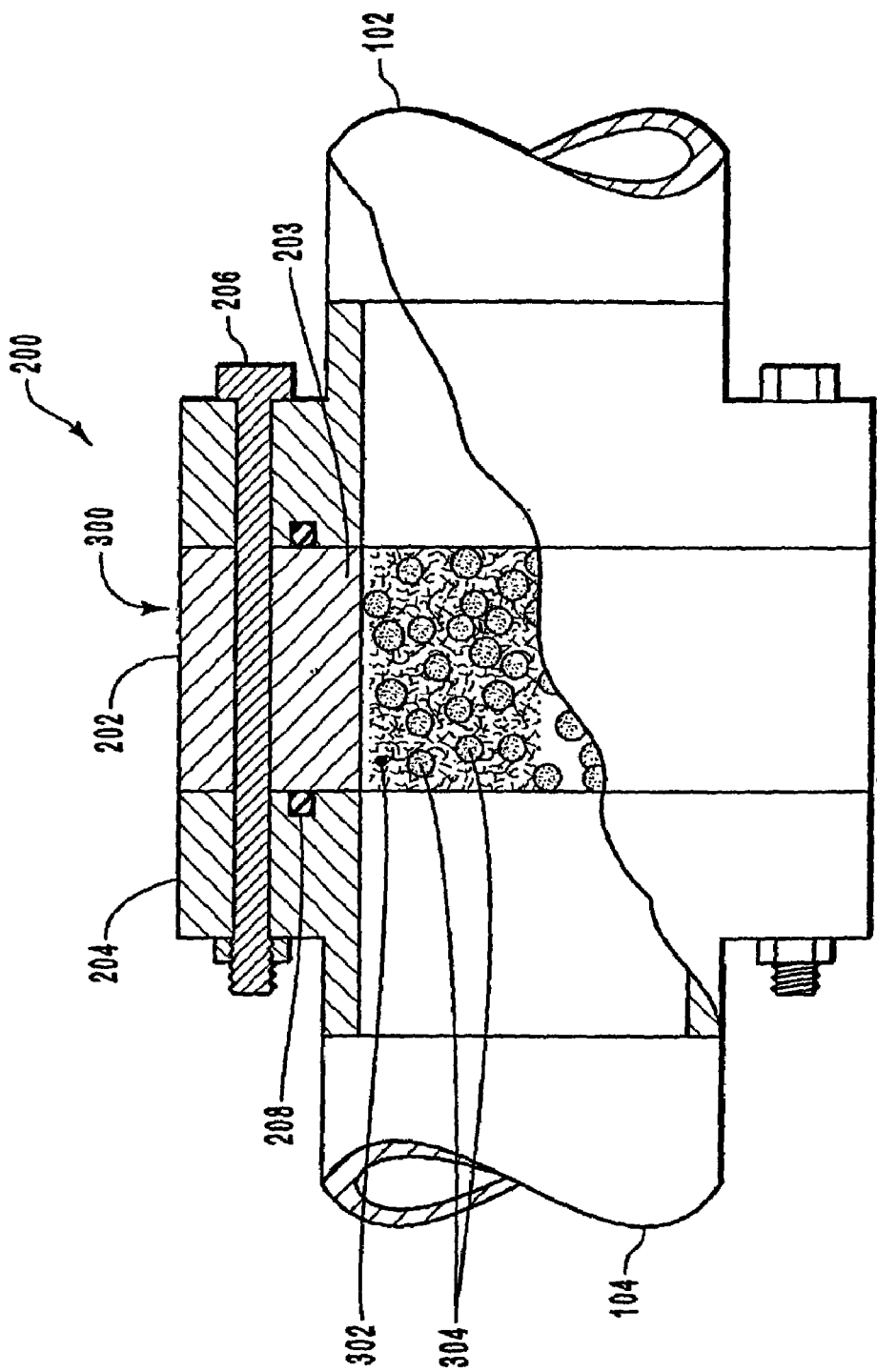
FIG. 2 illustrates various features of an embodiment of an ion processing assembly for use in an ion processing system.

Turning now to FIG. 2, various details and features of an embodiment of ion processing assembly 200 are indicated. In particular, ion processing assembly 200 includes a housing 202 which defines a chamber 203 in which ion processing element 300 is substantially confined. Features such as the geometry and/or dimensions of ion processing element 300 may be varied as required to suit a particular application and/or to facilitate achievement of one or more desired results. Ion processing element 300 comprises substrate 302 impregnated with composite medium 304. Composite medium 304, in turn, comprises matrix material 304A (see FIG. 3) which defines a plurality of pores 304B (see FIG. 3) that serve to support, i.e., contain, entrap, bond to, or otherwise include, attach, or retain in any way, one or more active components 304B (not shown).

With continuing reference to the details of ion processing assembly 200, housing 202 is disposed between, and removably retained by, flanges 204. As indicated in FIG. 2, flanges 204 are configured for connection to ion processing assembly inlet piping 102 and ion processing assembly outlet piping 104, respectively, so as to facilitate fluid communication between ion processing element 300 and ion processing assembly inlet piping 102 and ion processing assembly outlet piping 104. Of course, flanges 204 may be connected to ion processing assembly inlet piping 102 and ion processing assembly outlet piping 104 in a variety of other ways as well, including, but not limited to, welding, brazing, soldering, threaded connections, or the like. Bolts 206, or the like, removably secure housing 202 in place between flanges 204. Finally, O-rings 208, or the like, are interposed between the faces of flanges 204 and housing 202 so as to substantially prevent leakage of the fluid stream from ion processing assembly 200.

Note that a variety of means may be employed to perform the function of flanges 204, as disclosed herein. Thus, flanges 204 are but one example of a means for removably retaining housing 202. It should accordingly be understood that flanges 204 simply represent one embodiment of structure capable of performing this function and should not be construed as limiting the scope of the present invention in any way. For example, the functionality of flanges 204 could alternatively be achieved with various types of quick-release fittings, twist-lock type fittings, or the like.

Directing continuing attention to FIG. 2, the fluid stream from which one or more constituents are to be removed enters housing 202 by way of ion processing assembly inlet piping 102. As the fluid stream passes through substrate 302, one or more active component(s) 304B of composite medium 304 act to remove one or more constituents from the fluid stream. After passing through ion processing element 300, the fluid flow then exits ion processing assembly 200. Ion processing assembly outlet piping 104 then directs the fluid flow to at least one predetermined location. While ion processing assembly 200 is preferably oriented in a substantially vertical position, other orientations may alternatively be employed.

Figure 3:
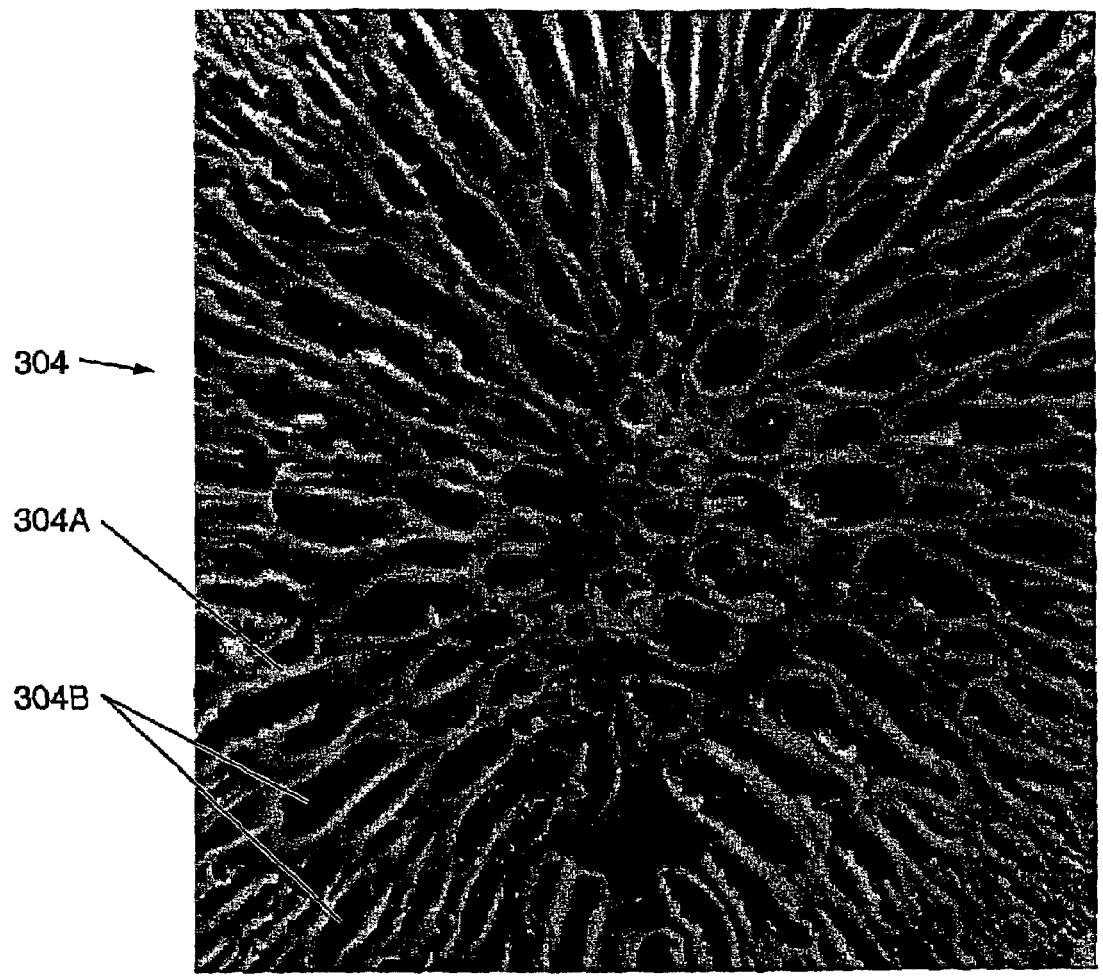
FIG. 3 is a negative image depiction of an embodiment of a composite medium.

With reference now to FIG. 3, additional details are provided regarding the geometry of an exemplary embodiment of composite medium 304 in accordance with the teachings of the present invention. As indicated in FIG. 3, composite medium 304 includes a matrix material 304A that defines a plurality of openings, or pores, 304B. Due to the large number of pores 304B, composite medium 304 accordingly defines a large surface area available to support one or more active component(s) 304B (not shown).

As noted elsewhere herein, it is generally the case that the effectiveness of an ion processing medium is at least partially a function of the size of the ion processing area with which the processed medium, typically a fluid, comes into contact. Thus, the relatively large surface area collectively defined by pores 304B of composite medium 304 facilitates a material improvement in processing capacity over known ion processing media and devices where it is often the case that only a fraction of the active component may come into contact with the fluid stream, or where the volume of active component that can be employed is otherwise restricted in some way. That is, due to the large surface area defined by pores 304B of composite medium 304, a relatively greater amount of active component 304B can be exposed to the fluid stream than is typically the case with known composite media.

Because relatively more active component 304B is exposed to the fluid stream than would otherwise be the case, a given volume of active component 304B, supported by matrix material 304A of composite medium 304, removes relatively more material from the fluid stream, and more quickly, than would a comparable volume of many known ion processing media. That is, composite medium 304 is relatively more efficient in removing materials from a fluid stream than are known composite media, and accordingly has a higher processing capacity than those materials.

In some instances at least, the processing capacity of active component 304B can be quantified as being the maximum value of the ratio of the mass of the ion removed from the fluid stream to the mass of active component 304B present in ion processing element 300. In view of the improved processing capacity of composite medium 304, the cost of an ion processing system employing composite medium 304 may be materially lower than the cost of devices employing less efficient ion processing materials.

Not only does the geometry of matrix material 304A of composite medium 304 serve to facilitate an increase in the ion processing capacity of active component 304B to a level materially higher than would otherwise be possible, but that geometry has other important implications as well. One such implication relates to the amount of active component 304B that matrix material 304A can effectively hold. In particular, the large pore volume defined by matrix material 304A of composite medium 304 permits the weight of active component 304B, as a percentage of the total weight of composite medium 304 to be varied over a wide range, from about 5% to about 95% by weight. In contrast, the weight percentage of active component in some known composite media is typically limited to a much narrower range.

Thus, composite medium 304 is well suited to facilitate wide variations in the concentrations, or loading, of active component 304B, and the loading of active component 304B in composite medium 304 may desirably be varied as required to suit particular applications and/or to achieve one or more desired results. Further, multiple active components 304B may be employed in composite medium 304 so as to produce a composite medium 304 that can be employed to effect simultaneous and substantial removal, or other processing, of more than one constituent of a fluid stream. As noted elsewhere herein, such active components may employ any of a variety of mechanisms to effectuate such removal and/or processing.

Finally, the flow characteristics of ion processing element 300 are materially enhanced by the fact that substrate 302 of ion processing element 300 is highly porous. Thus, ion processing element 300 is well-suited for use in high flow rate applications such as are encountered in industrial environments.

As the foregoing discussion suggests, ion processing element 300 possesses a number of properties which make it desirable for use in a wide range of applications, and which suits it particularly well for use in those situations wherein it is desired to effectively and efficiently treat high volume and/or high flow rate fluid streams. By way of example, the relatively large surface area defined by matrix material 304A of composite medium 304 facilitates high loading capacities and effective and efficient use of active component 304B. As another example, the porosity of substrate 302 permits fluid to flow readily through ion processing element 300 and thus facilitates effective and efficient processing of high flow rate fluid streams.

Attention is directed now to a discussion of various exemplary active components 304B. Generally, "active component" refers to those materials, however embodied, that use a variety of mechanisms to process the fluid stream, wherein such mechanisms include, but are not limited to, ion exchange, adsorption, absorption, extraction, complexation, or various combinations thereof. By employing one or more of such mechanisms, various embodiments of active components 304B are able to, among other things, remove, extract, separate, concentrate, or otherwise desirably process, one or more constituents of a fluid stream. Sorbents and similar materials comprise but one example of an active component.

In one embodiment, active component 304 comprises an inorganic compound such as crystalline silicotitanate (CST), or the like. However, any of a wide variety of other active components, both organic and inorganic, may be used, either individually or in various combinations, as required to suit a particular application and/or to achieve one or more desired effects. Exemplary active components include various types of carbon, ammonium molybdophosphate (AMP), octyl (phenyl) N,N-diisobutylcarbamoylmethylphosphine oxide (CMPO) and other carbamoyl phosphine oxides, 4,4'(5')di-(t-butylcyclohexano)-18-crown-6, bis (2,4,4-trimethylpentyl) dithiophosphinic acid, various amines, alkylphosphoric acids such as bis(2-ethylhexyl)phosphoric acid (HDEHP), neutral organophosphorus compounds such as tributyl phosphate (TBP), organic compounds such as crown ethers and polyethylene glycol (PEG) and their mixtures, and all organic extractants which are stable in the solution of the binding polymer, PAN for example, and are able to form an organic phase inside the matrix.

Organic active components such as activated carbon are particularly well-suited for the processing of water, and are effective in removing, among other things, chlorine, organic pesticides, and heavy metals such as mercury. Note that "carbon" includes activated carbon as well as various other types and forms of carbon or materials substantially comprising carbon. Further, active components 304B may also be employed in odor control applications, and air cleaning and/or purification, as well as for the removal of undesirable color(s) from a fluid stream, as might be the case in pharmaceutical applications. Additionally, various combinations of active components may be employed in conjunction with a particular volume of ion processing element 300 so as to facilitate achievement of one or more desired ion processing effects. Also, in some embodiments of the invention, multiple ion processing elements 300, each comprising one or more active components 304B, may be employed in a single ion processing system to facilitate removal of various constituents from a fluid stream.

Another embodiment of a composite medium 304 employs CMPO as active component 304B. CMPO is particularly useful in metal ion sorption applications including, but not limited to, treatment of radioactive waste solutions or analysis of samples, wherein those radioactive waste solutions and samples contain lanthanides such as such as europium (Eu) and cerium (Ce), or actinides such as americium, plutonium and uranium, or their compounds.

Furthermore, the present invention contemplates that composite medium 304 may be used in conjunction with a variety of substrate 302 materials so as to produce ion processing elements 300 having one or more particular desired properties. In one embodiment, substrate 302 substantially comprises fibrous glass, or the like. The fibrous nature of substrate 302 renders substrate 302 highly porous and thus materially enhances at least the kinetics and exchange capacity, and thus the overall performance, of ion processing element 300. Other substrate 302 materials contemplated as being within the scope of the present invention include, but are not limited to, Teflon™ materials, paper, and the like. In general however, any other material or combinations thereof, providing the functionality of fibrous glass, as herein disclosed, is contemplated as being within the scope of the present invention. Note that substrate 302 is not necessarily limited to fibrous materials, but substrates comprising any other material or combination thereof that would provide the functionality herein disclosed are contemplated as being within the scope of the present invention.

Finally, at least some embodiments of ion processing element 300 are effective in facilitating the processing of a fluid stream by filtration, as well as by ion processing. In particular, the fibrous nature of substrate 302 makes it well-suited to effectuate removal, by mechanical filtration, of one or more components of a fluid stream passing through ion processing element 300. Thus, embodiments of ion processing element 300 may incorporate both filtration and ion processing functionalities.

Figure 4:
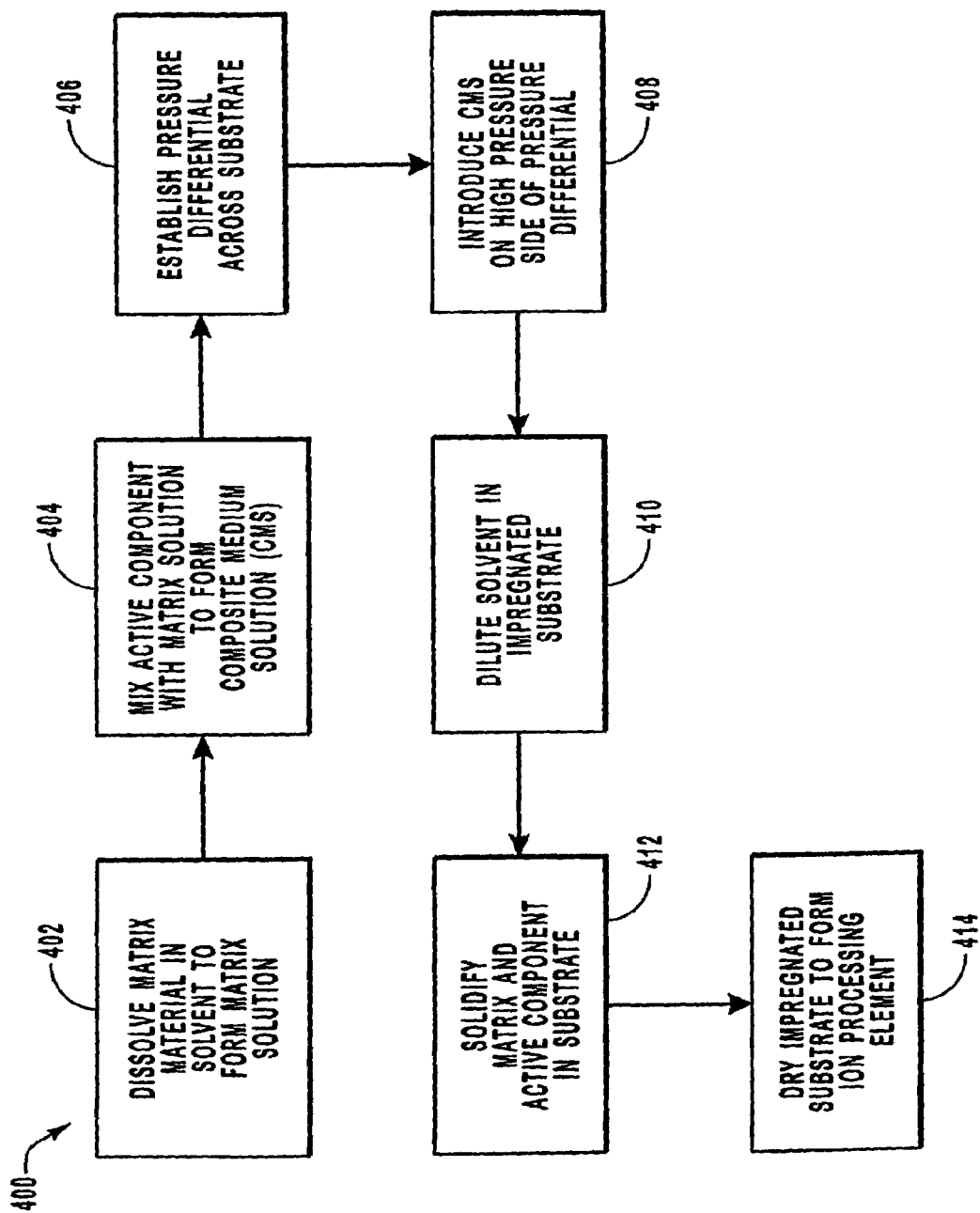
FIG. 4 indicates various steps of an embodiment of the ion processing element production process.

Directing attention now to FIG. 4, one embodiment of a process 400 for producing composite medium 304 is indicated. In step 402, a matrix material, preferably PAN in a solid form, is dissolved in a solvent to form a matrix solution whose concentration of PAN with respect to the solvent may be varied as required to facilitate achievement of a particular desired result.

As used herein, "PAN" includes; among other things, acrylonitrile polymer or copolymer containing at least forty percent (40%) acrylonitrile units. Typically, the acrylonitrile homopolymer includes crystalline, quasicrystalline, and amorphous phases. Note however, that various other polymeric matrix materials, both organic and inorganic, may profitably be substituted for PAN in order to suit the requirements of a particular application.

In one embodiment, the solvent comprises nitric acid. Other suitable solvents include, but are not limited to, aprotic polar organic solvents such as dimethylformamide, dimethylacetamide, dimethylsulfoxide (DMSO), sulfolane, ethylene carbonate, and Nmethylpyrrolidone, acids such as concentrated sulfuric acid, and concentrated aqueous solutions of certain inorganic salts such as lithium bromide, sodium thiocyanate, and zinc chloride. In general however, any solvent providing the functionality disclosed herein is contemplated as being within the scope of the present invention.

In one embodiment of process 400, step 402 is performed at room temperature (defined herein to be a range from about 50 degrees Fahrenheit to about 80 degrees Fahrenheit) and standard pressure (1.0 atmospheres, or 14.65 pounds per square inch), though it will be appreciated that other temperatures and/or pressures may be equally desirable for various applications or to achieve particular results.

Upon dissolution of the PAN in the solvent, process 400 then proceeds to step 404 wherein a pre-determined amount of one or more active components 304B is combined with the matrix solution to form the CMS. Alternatively, the CMS may be formed in-situ by precipitation or other processes. In the case where only organic active component(s) 304B are employed, the CMS comprises an emulsion while, on the other hand, where only inorganic active component(s) 304 are employed, the CMS comprises a suspension. As used herein however, "CMS" refers to any combination of solvent, matrix material, and active components, whether such combination takes the form of a suspension, emulsion, solution, or other form. In at least some embodiments of the invention, active component 304B comprises CST. As noted elsewhere herein however, a variety of active components 304B, both organic and inorganic, may be employed singly, or in various combinations so as to result in the formation of a CMS, and ultimately a composite medium 304 and ion processing element 300, having particular desired properties. It will further be appreciated that the amount of active component(s) 304B mixed with the matrix solution may be varied as required to achieve formation of a composite medium 304 having particular desired properties and capabilities.

After the CMS has been formed, process 400 proceeds to step 406, wherein a pressure differential is established across substrate 302. In one embodiment of method 400, the pressure differential is established by subjecting one side of substrate 302 to a vacuum. Upon establishment of the pressure differential, method 400 proceeds to step 408 wherein the CMS is introduced on the high pressure side of the pressure differential. The pressure differential causes the CMS to flow into, and substantially impregnate, substrate 302. In step 410, the CMS impregnated substrate 302 is then immersed in a water bath so that the solvent is diluted, removed, or otherwise neutralized, thereby resulting in a composite medium substantially comprising PAN and one or more active components 304. The temperature of the water bath may be varied as required to achieve a particular result or effect. Likewise, other aqueous solutions may be substituted for water so as to facilitate achievement of a desired result.

In one alternative embodiment, the solvent is reconstituted from the water bath by heating the water bath until the water evaporates and only solvent remains. In this way, the solvent can be reused for multiple processes. Various other techniques may alternatively be employed to facilitate reconstitution of the solvent.

Upon dilution, removal, or neutralization, of the solvent, composite medium 304 solidifies, as indicated in step 412 of process 400, and matrix material 304A entraps active component 304B. In step 414, substrate 302 is then dried, preferably in air, to form ion processing element 300. The air drying process lends mechanical strength and durability to composite medium 304 disposed in substrate 302. Such strength and durability makes ion processing element 300 well-suited to withstand rough handling and other adverse environmental conditions. After drying, ion processing element 300 is then ready for use.

Embodiments of ion processing element 300 according to the present invention may find application in a variety of fields. As suggested above, one such application concerns off-site sampling. In particular, ion processing element 300 could be constructed of a size and/or geometry selected to make it readily portable. Ion processing element 300 would then be carried to a sampling site and the desired fluid sample passed through ion processing element 300, so that various desired constituents of the fluid stream could be concentrated in ion processing element 300 by composite medium 304.

The constituents thus separated and concentrated would correspond to the active component(s) employed in ion processing element 300. Once processing of the sample has been completed, ion processing element 300 could then be easily returned to a laboratory or processing site for analysis. In this way, transportation and time/cost-intensive analysis of large samples would be precluded and the entire sampling and analysis process greatly simplified.

A variety of analyses may be performed on the ion processing element 300 after processing of the sample has been completed. Such analyses may include, for example, radiometric spectrometry. As another example, a gas flow proportional counter, or a gamma spectrometer, may be used to quantify the concentration of one or more of the materials deposited in the ion processing element 300. Such analyses produce a relative reduction in both the time and cost associated with some known analytical procedures.

Finally, ion processing element 300 may be cleaned for future re-use. For example, an ion processing element 300 containing plutonium removed from a fluid stream could be cleaned with oxalic acid or the like, so that the plutonium is substantially removed. Ion processing element 300 could then be reused as desired.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. An ion processing element suitable for facilitating processing of a fluid stream, the ion processing element comprising:

a substrate defining a plurality of pores; and
a composite medium disposed substantially throughout the plurality of pores of the substrate, the composite medium comprising:
a porous polymeric material defining another plurality of pores, wherein each pore of the substrate contains a plurality of pores defined by the porous polymeric matrix, and at least one active component contained within pores of the porous polymeric material, the at least one active component selected from the group consisting of carbon, a carbamoyl phosphine oxide, crystalline silicotitanate, ammonium molybdophosphate, and mixtures thereof.

2. The ion processing element as recited in claim 1, wherein the substrate comprises fibrous glass.

3. The ion processing element as recited in claim 1, wherein the porous polymeric material is organic.

4. The ion processing element as recited in claim 1, wherein the porous polymeric material comprises polyacrylonitrile.

5. The ion processing element as recited in claim 1, wherein the at least one active component comprises octyl (phenyl) N,N-diisobutylcarbamoylmethyl-phosphine oxide.

6. The ion processing element as recited in claim 1, wherein the porous polymeric material is inorganic.

7. An ion processing element useful in facilitating removal of at least one constituent from a fluid stream in contact with the ion processing element, the ion processing element comprising:

a composite medium disposed substantially throughout a plurality of pores in a fibrous glass substrate, the composite medium comprising:
 a polyacrylonitrile matrix defining another plurality of pores therein, wherein each pore of the substrate contains a plurality of pores defined by the polyacrylonitrile matrix; and
 at least one active component contained within the plurality of pores of the polyacrylonitrile matrix, the at least one active component selected from the group consisting of carbon, a carbamoyl phosphine oxide, crystalline silicotitanate, ammonium molybdophosphate, and mixtures thereof.

8. The ion processing element as recited in claim 7, wherein the at least one active component is organic.

* * * * *